May 2, 1967 D. F. HILBIBER 3,317,850

TEMPERATURE-STABLE DIFFERENTIAL AMPLIFIER
USING FIELD-EFFECT DEVICES
Filed April 29, 1963

INVENTOR.
DAVID F. HILBIBER

United States Patent Office 3,317,850
Patented May 2, 1967

3,317,850

TEMPERATURE-STABLE DIFFERENTIAL AMPLIFIER USING FIELD-EFFECT DEVICES

David F. Hilbiber, Los Altos, Calif., assignor to Fairchild Camera and Instrument Corporation, Syosset, N.Y., a corporation of Delaware Filed Apr. 29, 1963, Ser. No. 276,262
1 Claim. (Cl. 330—23)

This invention relates to a new, temperature-stable differential amplifier using field-effect devices, and to a method of reducing the temperature input drift of a two-channel differential amplifier using field-effect devices.

Recent advances in the technology of field-effect devices (commonly known as field-effect transistors or "FET's") are now making possible new applications of these devices. One such application is a differential amplifier requiring a matched pair of FET's. Certain difficulties have been encountered in matching the two required FET's for a differential amplifier. A mismatch unfortunately often results in severe drift of the effective input voltage with varying temperature. In the past, standard operating procedure has been to choose as an operating point of the differential amplifier that which results in optimum frequency response; this point of optimum response has been found to obtain when a maximum source-drain current is employed. The reason for this is that as current through the channel of an FET is increased, transconductance, $g_m$, increases proportionately. The voltage gain of an FET used as an amplifier stage operating into a load with impedance Z is given by the relationship:

$$A_v = g_m Z$$

where Z is much smaller than the output impedance of the FET—as is usually the case.

For a typical load having a resistor in parallel with a capacitor, the term $1/\omega C$ may be substituted for Z, as follows:

$$A_v = \frac{g_m}{\omega C}$$

Assuming that the amplifier has a certain voltage amplification factor $A_0$, and that the load capacitance C remains constant, the frequency limitation $\omega$ is directly proportional to $g_m$—that is, as $g_m$ becomes greater (with increased channel current), $\omega$ also becomes greater.

The maximum value of usable channel current is reached when the gate voltage, $V_g$, is zero. Should the channel current be increased further, so as to result in gate current flow, the consequent distortion would outweigh any advantages obtained thereby.

The operating point is selected to optimize frequency response, as described above, the temperature sensitivity of the amplifier has been found to be quite poor. Temperature sensitivity is improved by selection of FET's as nearly identical as possible for each circuit path, but such careful screening of individual devices is very difficult. This invention proposes the use of an entirely different operating point whose selection represents a radical departure from present teaching in the art. Instead of selecting maximum channel current level for each FET to be used, a preliminary chart is prepared, plotting source-drain current against gate voltage at various temperatures covering the range to which the amplifier might be subjected in normal use. From this plot, a desirable value of source-drain current may be selected for each FET, and the device is operated at that current. An FET pair having similar operating values of source-drain current is then chosen.

The selected FET's may be used in a conventional FET differential amplifier, having two circuit paths with one FET in each. The voltage supply is connected to the drain electrodes of each device. Conventionally, the drain electrode is the electrode connected to a positive terminal of the voltage supply. The source electrodes of both FET's are connected to a common current sink which maintains the source-drain or channel current of each device constant at a value determined by the current sink itself. This operating value is selected for each FET according to the method of the invention (as described briefly above), in order to reduce the temperature sensitivity of the amplifier by a substantial amount. It has been surprisingly discovered that no excessive impairment of the amplifier's frequency response results from this radical departure from prior-art current level selection.

When the FET differential amplifier is to be operated or tested with a common mode output voltage, certain additional problems are encountered. Whenever the common mode voltage varies, the change appears entirely as a drop across the FET's. Stability in spite of common mode voltage variations is a characteristic test of an amplifier's quality. The change in voltage drop across the FET's resulting from a common mode voltage variation can shift the operating point of the FET's appreciably. Such a shift results in distortion of the operating characteristics of the amplifier and gives poor test yields.

Still another problem arises from the noise of the device itself; this noise is dependent upon source-to-drain voltage. Again, such noise will substantially and detrimentally alter the operating characteristics of the amplifier.

Both the noise of the device and its sensitivity to variations in common mode voltage are reduced many-fold by the improved FET differential amplifier of a preferred embodiment of this invention, using two FET's in each circuit path. The first FET acts as a buffer for the second; such a buffer FET absorbs voltage changes due to device noise or to common mode voltage variations, so that the source-drain voltage of the input FET—the one which actually determines the operating characteristics of the amplifier—is relatively unaffected. The effect on the operating characteristics of the amplifier produced by a variation in common mode voltage can be reduced by a factor of 100–200 or more, by use of the double FET differential amplifier of the preferred embodiment of this invention.

The amplifiers themselves, as well as the method of selecting the source-drain current levels, will be best understood from the following detailed description, making reference to the drawings, in which.

Figure 1:
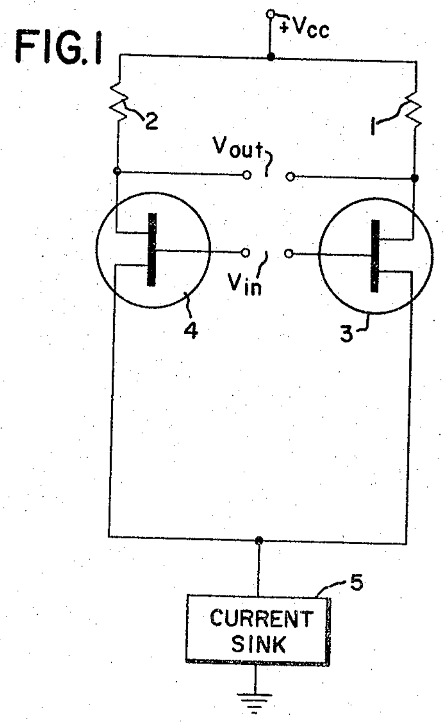
FIG. 1 is a schematic circuit diagram of a conventional FET differential amplifier.

A simple, conventional differential amplifier circuit using two FET's is shown in FIG. 1. In this circuit a biasing voltage $V_{cc}$ is applied to two load resistors 1 and 2 (one for each circuit path) which are connected in series with the drain electrodes of two FET's 3 and 4. The FET source electrodes are common, and are connected to a current sink 5. The input voltage signal appears across the gate electrodes of the FET's, and the output signal appears across the drain electrodes.

Figure 2:
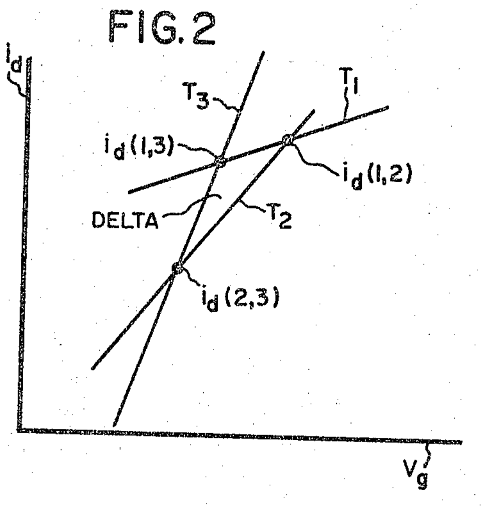
FIG. 2 is a plot of drain current vs. grid voltage for a typical FET at three different temperatures.

The chief requirement for the FET's in themselves is that they should pinch off at some reasonable value of gate voltage $V_g$. This pinchoff may occur in the range of about one to seven volts. A plot of source-drain current vs. gate voltage may be constructed for such a FET, as shown in FIG. 2. With a fixed $V_{cc}$, source-drain current $i_d$ is measured at various values of gate voltage $V_g$. A separate curve is made of three different temperatures. These curves tend to be reasonably linear, and it will be observed that the lines tend to shift somewhat in slope with change in temperature. Two of the selected temperatures represent the extremes to which the FET is likely to be subjected when used in the differential amplifier; a value between the extremes is chosen for the third temperature, to serve as a check.

As shown in FIG. 2, the curves for the three different temperatures $T_1$, $T_2$, and $T_3$, intersect in a triangle or delta. Each point of the delta represents a value of source-drain current for the device. These points are shown on the plot of FIG. 2 as $i_d$ (1, 3) where curves $T_1$ and $T_3$ intersect; $i_d$ (2, 3) where curves $T_2$ and $T_3$ intersect; and $i_d$ (1, 2) where curves $T_1$ and $T_2$ intersect. Selection of an operating $i_d$ somewhere between the two extremes of these three values of $i_d$ has been found to provide maximum temperature stability.

This area, it will be seen, represents only a preferred range of $i_d$. Generally speaking, an amount representing about one-half the maximum spread of the $i_d$ values within the delta may be subtracted from the original lower $i_d$ limit to provide a still lower limit; a higher limit may similarly be obtained by adding this amount to the original upper limit. A temperature lying within this new broader range will still provide an operating improvement over the temperature sensitivity of those differential amplifiers whose $i_d$ has been selected according to the previous teaching of the art (for maximum frequency response).

For testing a differential amplifier, a standard procedure known in the art as the "common mode" evaluation is used. For this test, both gate inputs are tied to a common mode voltage and the resulting output is measured. Ideally, the output voltage should remain unchanged regardless of changes in the common mode input voltage. Were this the actual case, measurements made using the differential amplifier as a unity gain buffering amplifier to provide a high input impedance would be very accurate.

In the conventional circuit of FIG. 1, however, the output voltage has a definite tendency to shift with variations in the common mode voltage. When this voltage, at the gates of the FET's, shifts away from the direction which causes pinchoff, the source-drain voltage drop is decreased, causing an appreciable shift in the operating point of the FET. Even when the original operating point is selected according to the method of this invention, as described above, the resultant shift following a change in common mode voltage may remove the operating point from the desired range. In that event, differences between the FET's characteristics will become pronounced, and the output voltage will change. To avoid this problem, the circuit of this invention shown schematically in FIG. 3 is employed.

Figure 3:
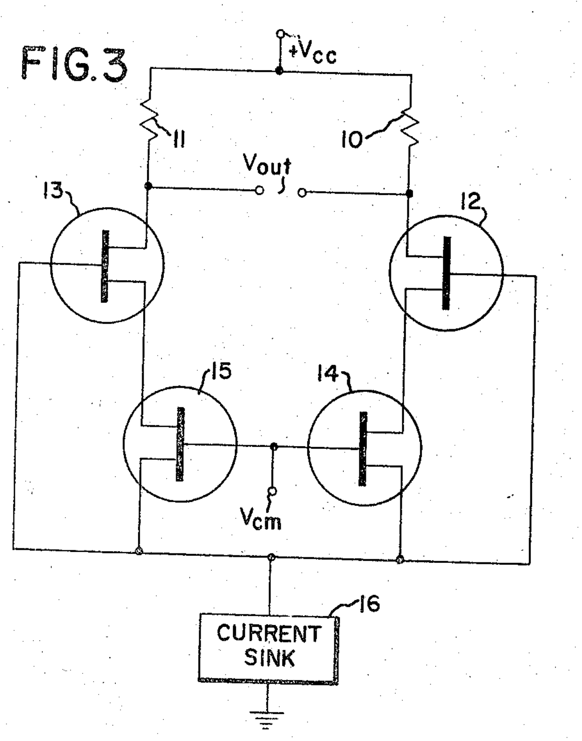
FIG. 3 is a schematic circuit diagram of a differential amplifier of this invention using four FET's.

Referring now to FIG. 3, resistors 10 and 11 serve as load resistors. In the path of resistor 10, the source of FET 12 is connected to the drain of FET 14; FET's 13 and 15 are similarly connected. The gate electrodes of the upper FET's 12 and 13 are connected to the source electrodes of the lower FET's 14 and 15, respectively. All the connected gate and source terminals are connected to current sink 16.

During test operation, the gate electrodes of both the lower FET's 14 and 15 are connected to a common mode voltage supply $V_{cm}$. The output voltage $V_{out}$ is measured across the drain electrodes of the upper FET's 12 and 13, as shown. To illustrate the effect of a variation in common mode voltage $V_{cm}$, it is helpful to assume some realistic values for these voltages. Suppose $V_{cc}$ to be +30 volts, and a 5-volt drop to exist across each of resistors 10 and 11. This will result in an output voltage $V_{out}$ of about 25 volts on each output terminal. If the common mode voltage is a ground (0 volts), each 25-volt drop from output to ground will divide between the two FET's in its respective path. A realistic division for a matched pair of FET's will be about 19 volts across each of the upper FET's (from drain to source), and about 3 volts across each of the lower FET's (from drain to source). The remaining 3 volts will appear between the source electrodes of the lower FET's 14 and 15, and ground (across current sink 16).

Now suppose the common mode voltage $V_{cm}$ to be raised from 0 to 10 volts. Substantially this entire voltage change will appear across the upper FET's. The source voltage of the upper FET's will increase from the previous 6 volts to about 16 volts. The output signal remains constant (at the drain electrodes of the upper FET's) at about 25 volts. Hence, it may be seen that the drop across the upper FET's has been decreased from 19 volts to about 9 volts. The voltage across current sink 16 will have been increased by almost the entire 10 volts added to the lower FET gate voltage. In consequence, both the source voltage and the drain voltage of the lower FET's will have been increased by the amount of the upper FET gate voltage increase, and the voltage drop across the lower devices will remain virtually unchanged. In prior-art circuits, the drop would appear across the input FET's (in this instance, the only FET's); in the circuit shown in FIG. 3 there will be almost no change in the drop across the input FET's. The operating point thus remains constant at the selected value, determined by the method of this invention.

Achievement of a constant voltage across the lower FET's in spite of variations in the common mode signal has some very important advantages. For one, the temperature stability resulting from the method of this invention is unaffected by changes in common mode voltage. The operating point will remain constant regardless of these changes. For another, the amplifier of this invention may be used as a unity gain buffering stage for large input signal voltages. (A unity gain amplifier is one in which an output signal precisely identical to the input signal is desired.) Large voltage input signals raise the voltage above ground on both terminals of the amplifier. These signals therefore effectively appear as a common mode signal. Should changes in the common mode voltage result in voltage differences between the two circuit paths, as was often the case with prior-art amplifiers, the amount of these differences would be added to the output signal, resulting in output error. The amplifier of the present embodiment of the invention, being exceptionally stable even in the presence of common mode voltage variations, is particularly advantageous for the purpose of a unity gain device.

Figure 4:
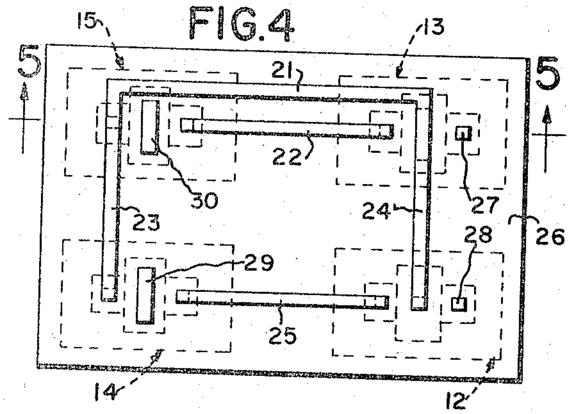
FIG. 4 is a plan view of an integrated circuit of four FET's connected as in the schematic diagram of FIG. 3, all formed on a single wafer of semiconductor material.
Figure 5:
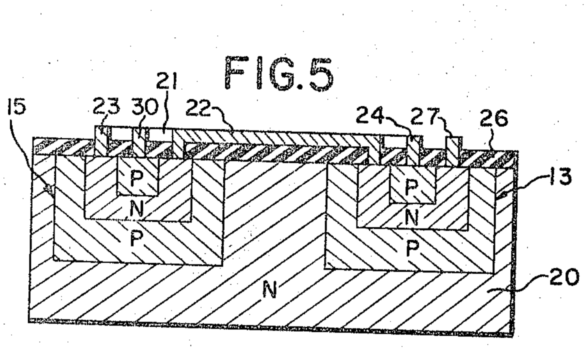
FIG. 5 is a transverse section taken along line 5—5 of FIG. 4.

The device shown in FIG. 3 may be fabricated essentially in a single wafer of semiconductor material as shown in FIGS. 4 and 5. It is certainly desirable that the four field-effect devices be so integrated. The four devices 12, 13, 14, and 15 are all formed in a single wafer 20 of semi-conductor material. One process for making such a device, using epitaxially grown silicon, is described in copending application Ser. No. 262,999, assigned to the same assignee as this invention.

The metal interconnections 21, 22, 23, 24, and 25 are deposited on the surface of the device according to the teachings of U.S. Patent 2,981,877, also assigned to the same assignee as this invention. Connection 21 passes through the oxide coating layer 26 on the wafer to contact one channel electrode of device 15 and the gate electrode of device 13. Connection 22 contacts one channel electrode of each of devices 13 and 15, and connection 25 connects one channel electrode of each of devices 12 and 14. Connection 23 connects one channel electrode of device 15 with one channel electrode of device 14, and connection 24 connects the gates of devices 12 and 13.

Electrodes 27 and 28 serve as the output electrodes as well as for the electrodes to which the biasing voltage $V_{cc}$ is connected. The input voltage passes into the gates of devices 14 and 15 through electrodes 29 and 30, respectively. Current sink 16 (FIG. 3) may be attached to connections 21, 23, or 24, at any point thereon.

By the way of illustration, and not of further limitation on the generalities of the invention, the following example is presented.

*Example*

A PNP field-effect device was tested at various negative gate voltages in three separate tests. Each test was carried out at a different temperature, with the change in drain current with gate voltage being measured at that temperature. The temperatures selected were those in the range to which the device might be subjected in actual operation. As extremes, 0° C. and 90° C. were chosen, with 25° as the mean temperature between them. The resultant three curves are shown as a graph in FIG. 2. The 0° curve and the 25° curve intersect at the values of −0.467 volt gate voltage and 54.1 μa. drain current, represented as point $i_d$ (2, 3). The 26° curve and the 90° curve intersect at −0.513 volt gate voltage and 62.8 μa. drain current, point $i_d$ (1, 2). The 0° and 90° curves (the extremes) intersect at −0.502 volt gate voltage and 60.6 μa. drain current, point $i_d$ (1, 3).

Using the values corresponding to each of these points of intersection, another experiment was run to determine the equivalent input drift with temperature, for each of the three points. The drift value ($dV_g/dT$) expressed in μv./° C. gives the input drift factor of the device at the given values of drain current and gate voltage. The resulting factors are shown in the following table.

| Point: | Drift (μv./° C.) |
|---|---|
| $i_d$ (**2, 3**) | −70 |
| $i_d$ (**1, 2**) | +60 |
| $i_d$ (**1, 3**) | 0±10 |

From this table it may be seen that the input drift value ranged between +60 and −70 μv./° C. at any point within the delta obtained from the points of intersection of the three curves (0°, 25°, 90°). This area represents a desirable operating range for the amplifier. Naturally, the optimum choice would be that value of drain current yielding the lowest possible input drift; this would appear to be $i_d$ (1, 3), or 60.6 μa. However, if a broader operating range is desired, any value of drain current within the delta's extremes (FIG. 2) would be operable.

In fact, it is possible to select a current value somewhat outside the delta and still retain much of the advantage of the invention. For example, note that the values of drain current within the delta range from 54.1 μa. to 62.8 μa., representing a total spread of 8.7 μa. By subtracting one-half of that amount (4.3 μa.) from the lowest value within the delta (54.1 μa.) and also adding it to the highest value (62.8 μa.), a new range of 49.8 μa. to 67.1 μa. will be obtained. Input drift with temperature, by experiment, was found to be about −130 μv./° C. at 49.8 μa., and about +120 μv./° C. at 67.1 μa. While these drift values are not the most desirable, an operable amplifier would still be obtained if the field-effect devices in each channel had similar drift values. But when the drift value exceeds about 100 μv./° C., the drift tends to become non-linear, thus making proper selection of matching field-effect devices much more difficult.

As will be apparent to one skilled in the art, the circuits of this invention might be fabricated in many other different ways, integrated or not, and still be within the scope of the invention. Furthermore, modifications in the method of achieving temperature stability may be made without departing from the spirit and scope of the invention. Therefore, the only limitations to be placed on the scope of the invention are those expressed in the claim which follows.

What is claimed is:

A field-effect differential amplifier with a stable output independent of changes in common mode voltages, which comprises:

a pair of duplicate circuit paths, each having
- a first field-effect device having a channel, a gate, two electrodes for passing current through said channel, and an electrode for applying a voltage to said gate,
- means for supplying a current into a first of said two electrodes, said first electrode being unconnected to said gate,
- output means couples to said first electrode,
- a second field-effect device having a channel, a gate, two electrodes for passing current through said channel, and an electrode for applying a voltage to said gate,
- input means coupled to the gate electrode of said second field-effect device.
- means coupling a first of said two electrodes of said second field-effect device to the second of said two electrodes of said first field-effect device, and
- means coupling the second of said two electrodes of said second field-effect device with the gate electrode of said first field-effect device; and a common current sink coupled to the second electrode of said two electrodes of each device, said field-effect devices and the magnitude of the current flowing into said current sink being proportioned to minimize variations in the amount of source-drain current in each of said field-effect devices while simultaneously minimizing variations in the source-gate voltage with temperature variations over a reasonable range for a predetermined value of said current magnitude.

References Cited by the Examiner

UNITED STATES PATENTS 3,024,422 3/1962 Jansson ............ 330—18

ROY LAKE, *Primary Examiner.*

NATHAN KAUFMAN, *Examiner.*